(12) United States Patent
Fee et al.

(10) Patent No.: US 7,528,007 B2
(45) Date of Patent: May 5, 2009

(54) METHODS FOR ASSEMBLING SEMICONDUCTOR DEVICES AND INTERPOSERS

(75) Inventors: Setho Sing Fee, Singapore (SG); Lim Thiam Chye, Singapore (SG); Steven W. Heppler, Boise, ID (US); Leng Nam Yin, Singapore (SG); Keith Tan, Singapore (SG); Patrick Guay, Singapore (SG); Edmund Lua Koon Tian, Singapore (SG); Yap Kah Eng, Singapore (SG); Eric Tan Swee Seng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 244 days.

(21) Appl. No.: 11/411,287

(22) Filed: Apr. 25, 2006

(65) Prior Publication Data

US 2006/0194373 A1 Aug. 31, 2006

Related U.S. Application Data

(60) Division of application No. 10/863,447, filed on Jun. 8, 2004, now Pat. No. 7,274,095, which is a continuation of application No. 09/839,180, filed on Apr. 19, 2001, now Pat. No. 6,746,894.

(30) Foreign Application Priority Data

Mar. 30, 2001 (SG) .............................. 200101969

(51) Int. Cl.
H01L 21/50 (2006.01)
H01L 21/48 (2006.01)
H01L 21/44 (2006.01)
(52) U.S. Cl. ...................... 438/106; 438/617; 438/112; 438/118
(58) Field of Classification Search .................. 438/106, 438/112, 118, 617
See application file for complete search history.

(56) References Cited

U.S. PATENT DOCUMENTS

| 4,974,057 | A | 11/1990 | Tazima |
| 5,198,963 | A | 3/1993 | Gupta et al. |
| 5,468,681 | A | 11/1995 | Pasch |
| 5,506,383 | A | 4/1996 | Chen |
| 5,541,450 | A | 7/1996 | Jones et al. |
| 5,639,695 | A | 6/1997 | Jones et al. |
| 5,801,438 | A | 9/1998 | Shirakawa et al. |

(Continued)

OTHER PUBLICATIONS

Australian Search Report, dated Feb. 28, 2005 (3 pages).

*Primary Examiner*—Luan C Thai
(74) *Attorney, Agent, or Firm*—TraskBritt

(57) ABSTRACT

A method for assembling one or more semiconductor devices with an interposer includes positioning the one or more semiconductor devices within a receptacle that extends through the interposer, on a retention element that extends over at least a portion of the receptacle. Material may be introduced between at least a portion of an outer periphery of the one or more semiconductor devices and an inner periphery of the interposer to facilitate securing of the one or more semiconductor devices in place relative to the interposer. The retention element may be removed from the semiconductor devices. Once the one or more semiconductor devices are in place, they may be electrically connected to the interposer.

22 Claims, 8 Drawing Sheets

U.S. PATENT DOCUMENTS

| | | |
|---|---|---|
| 5,808,878 A | 9/1998 | Saito et al. |
| 5,841,191 A | 11/1998 | Chia et al. |
| 5,869,894 A | 2/1999 | Degani et al. |
| 5,926,029 A | 7/1999 | Ference et al. |
| 5,949,135 A | 9/1999 | Washida et al. |
| 5,977,640 A | 11/1999 | Bertin et al. |
| 5,998,859 A | 12/1999 | Griswold et al. |
| 6,084,308 A | 7/2000 | Kelkar et al. |
| 6,100,804 A | 8/2000 | Brady et al. |
| 6,121,682 A | 9/2000 | Kim |
| 6,137,164 A | 10/2000 | Yew et al. |
| 6,154,370 A | 11/2000 | Degani et al. |
| 6,172,419 B1 | 1/2001 | Kinsman |
| 6,201,302 B1 | 3/2001 | Tzu |
| 6,229,215 B1 | 5/2001 | Egawa |
| 6,326,696 B1 | 12/2001 | Horton et al. |
| 6,343,019 B1 | 1/2002 | Jiang et al. |
| 6,365,962 B1 | 4/2002 | Liang et al. |
| 6,365,963 B1 | 4/2002 | Shimada |
| 6,388,333 B1 | 5/2002 | Taniguchi et al. |
| 6,392,296 B1 | 5/2002 | Ahn et al. |
| 6,395,578 B1 | 5/2002 | Shin et al. |
| 6,414,381 B1 | 7/2002 | Takeda |
| 6,414,396 B1 | 7/2002 | Shim et al. |
| 6,441,495 B1 | 8/2002 | Oka et al. |
| 6,452,278 B1 | 9/2002 | DiCaprio et al. |
| 6,469,376 B2 | 10/2002 | Vaiyapuri |
| 6,469,395 B1 | 10/2002 | Nishihara et al. |
| 6,506,633 B1 | 1/2003 | Cheng et al. |
| 6,515,356 B1 | 2/2003 | Shin et al. |
| 6,518,655 B2 | 2/2003 | Morinaga et al. |
| 6,636,334 B2 | 10/2003 | Nakamura |
| 6,693,362 B2 | 2/2004 | Seyama et al. |
| 6,707,141 B2 | 3/2004 | Akram |
| 6,731,015 B2 | 5/2004 | Wu et al. |
| 6,762,078 B2 | 7/2004 | Shin et al. |
| 6,791,195 B2 | 9/2004 | Urushima |
| 6,798,049 B1 | 9/2004 | Shin et al. |
| 6,906,415 B2 | 6/2005 | Jiang et al. |
| 6,916,682 B2 | 7/2005 | Gerber et al. |
| 2001/0004128 A1 | 6/2001 | Park et al. |
| 2004/0106229 A1 | 6/2004 | Jiang et al. |

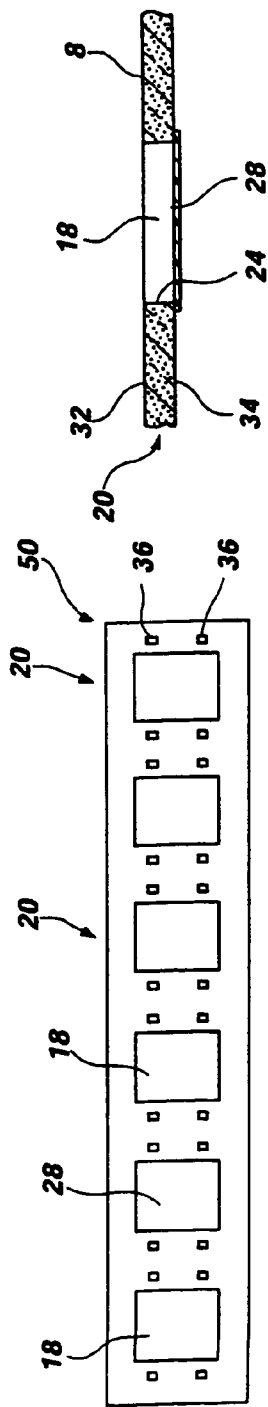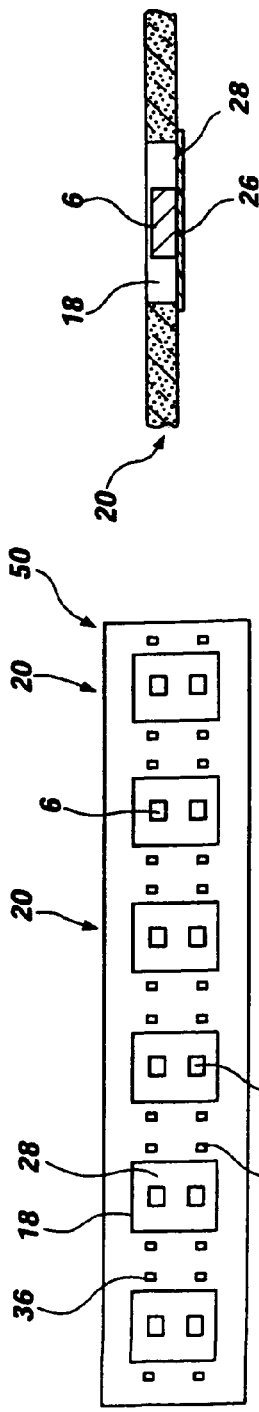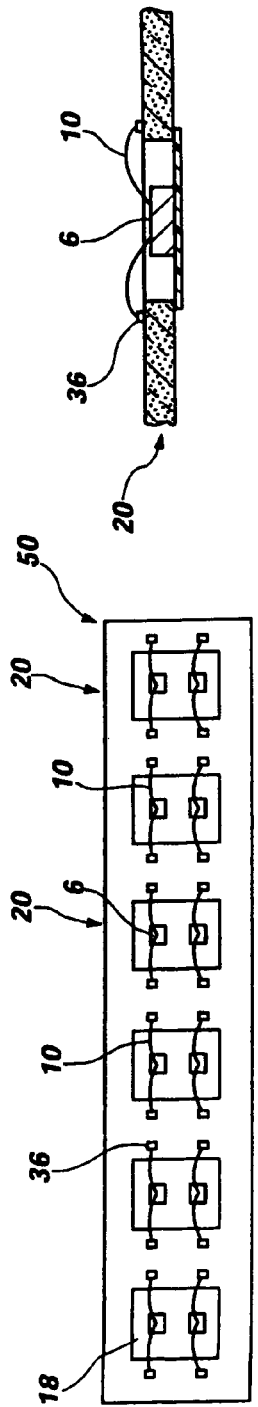

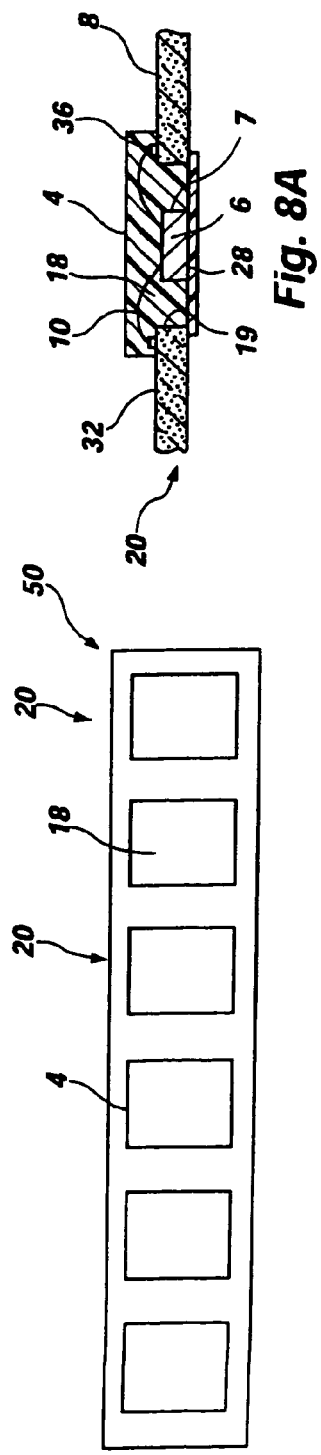
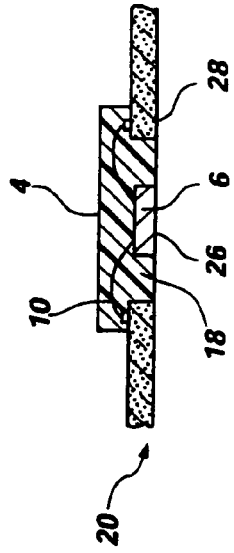
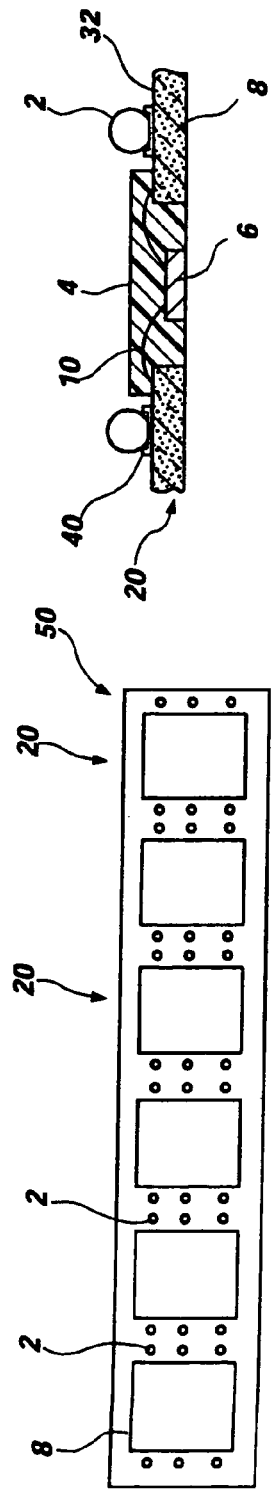

METHODS FOR ASSEMBLING SEMICONDUCTOR DEVICES AND INTERPOSERS

CROSS-REFERENCE TO RELATED APPLICATIONS

This application is a divisional of application Ser. No. 10/863,447, filed Jun. 8, 2004, now U.S. Pat. No. 7,274,095, issued Sep. 25, 2007, which is a continuation of application Ser. No. 09/839,180 filed Apr. 19, 2001, now U.S. Pat. No. 6,746,894, issued Jun. 8, 2004.

TECHNICAL FIELD

The present invention relates generally to packaged semiconductor devices with ball grid array (BGA) connection patterns and, more specifically, to packages having thicknesses that are only slightly greater than the thickness of their associated interposers. Particularly, the present invention relates to package interposers with receptacles formed therein that extend substantially through the thicknesses of the interposers and that are configured to receive semiconductor devices in such a manner that active surfaces of the semiconductor devices are located in or below substantially the same planes as the corresponding upper surfaces of the interposers.

BACKGROUND OF THE INVENTION

The dimensions of many different types of state of the art electronic devices are ever decreasing. To reduce the dimensions of electronic devices, the structures by which the microprocessors, memory devices, other semiconductor devices, and other electronic componentry of these devices are packaged and assembled with circuit boards must become more compact.

One approach to reducing the sizes of assemblies of semiconductor devices and circuit boards has been to minimize the profiles of the semiconductor devices and other electronic components upon carrier substrates (e.g., circuit boards) so as to reduce the distances the semiconductor devices protrude from the carrier substrates. Various types of packaging technologies have been developed to facilitate orientation of semiconductor devices upon carrier substrates in this manner.

Some semiconductor device packages are configured to be oriented substantially parallel to a plane of a carrier substrate, such as a circuit board. Conventionally, semiconductor device packages included several layers stacked one on top of another (e.g., a bottom layer of encapsulant material, a die-attach paddle of a lead frame, a semiconductor die, and a top layer of encapsulant material). In addition, the leads or pins of conventional semiconductor device packages, which electrically connect such packages to carrier substrates, as well as provide support for the packages, are sometimes configured to space the semiconductor device packages apart from a carrier substrate. As a result, the overall thicknesses of these semiconductor device packages and the distances the packages protrude from carrier substrates are larger than is often desired for use in state of the art electronic devices.

"Flip-chip" technology, or controlled collapse chip connection (C-4), is another example of an assembly and packaging technology that results in a semiconductor device being oriented substantially parallel to a carrier substrate, such as a circuit board. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which typically has a ball grid array connection pattern, typically includes a semiconductor die and a substrate, which is typically termed an "interposer". The interposer may be disposed over either the back side of the semiconductor die or the front (active) surface thereof.

When the interposer is positioned adjacent the back side of the semiconductor die, the bond pads of the semiconductor die are typically electrically connected by way of wire bonds or other intermediate conductive elements to corresponding contact areas on a top side of the interposer. These contact areas communicate with corresponding bumped contact pads on the back side of the interposer. This type of flip-chip assembly is positioned adjacent a carrier substrate with the back side of the interposer facing the carrier substrate.

If the interposer is positioned adjacent the active surface of the semiconductor die, the bond pads of the semiconductor die may be electrically connected to corresponding contact areas on an opposite, top surface of the interposer by way of intermediate conductive elements that extend through one or more holes formed in the interposer. Again, the contact areas communicate with corresponding contact pads on the interposer. In this type of flip-chip semiconductor device assembly, however, the contact pads are also typically located on the top surface of the interposer. Accordingly, this type of flip-chip assembly is positioned adjacent a carrier substrate by orienting the interposer with the top surface facing the carrier substrate.

In each of the foregoing types of flip-chip semiconductor devices, the contact pads of the interposer are disposed in an array that has a footprint that mirrors an arrangement of corresponding terminals formed on a carrier substrate. Each of the bond (on bare flip-chip semiconductor dice) or contact (on flip-chip packages) pads and its corresponding terminal may be electrically connected to one another by way of a conductive structure, such as a solder ball, that also spaces the interposer some distance away from the carrier substrate.

The space between the interposer and the carrier substrate may be left open or filled with a so-called "underfill" dielectric material that provides additional electrical insulation between the semiconductor device and the carrier substrate. In addition, each of the foregoing types of flip-chip type semiconductor devices may include an encapsulant material covering portions or substantially all of the interposer and/or the semiconductor die.

The thicknesses of conventional flip-chip type packages having ball grid array connection patterns are defined by the combined thicknesses of the semiconductor die, the interposer, and the conductive structures (e.g., solder balls) that protrude above the interposer or the semiconductor die. As with the flat packages, conventional flip-chip type packages are often undesirably thick for use in small, thin, state of the art electronic devices.

Thinner, or low-profile, flip-chip type packages have been developed which include recesses that are configured to at least partially receive semiconductor devices. While interposers that include recesses for partially receiving semiconductor devices facilitate the fabrication of thinner flip-chip type packages, the semiconductor dice of these packages, as well as intermediate conductive elements that protrude beyond the outer surfaces of either the semiconductor dice or the interposers, undesirably add to the thicknesses of these packages.

U.S. Pat. No. 5,639,695, issued to Jones et al. (hereinafter "the '695 Patent"), discloses another type of flip-chip type package, which includes an interposer with a semiconductor die receptacle extending completely therethrough. The '695 Patent teaches that the package may be formed by securing the semiconductor die directly to a carrier substrate and electrically connecting the interposer to the carrier substrate before the semiconductor die is electrically connected to the interposer. The semiconductor die, intermediate conductive elements that connect bond pads of the semiconductor die to corresponding contact areas on the interposer, and regions of the interposer adjacent the receptacle may then be encapsulated. While this method results in a very low-profile flip-chip type package, the package cannot be tested separately from the carrier substrate. As a result, if the package is unreliable, it may also be necessary to discard the carrier substrate and any other components thereon. Moreover, the packaging method of the '695 Patent complicates the process of connecting semiconductor devices and other electronic componentry to a carrier substrate.

Thus, there is a need for low-profile flip-chip type packages that may be tested prior to their assembly with a carrier substrate and without adding complexity to the process of assembling electronic components to the carrier substrate. A method for fabricating such low-profile flip-chip type packages is also needed.

SUMMARY OF THE INVENTION

The present invention includes a flip-chip type package interposer having a ball grid array connection pattern, packages including the interposer, and methods for assembling and packaging one or more semiconductor devices with the interposer.

The package interposer of the present invention includes a substantially planar substrate with a receptacle formed therein and extending substantially through a thickness thereof. The receptacle is configured to receive one or more semiconductor devices (e.g., dice) in such a manner that the active surface of each semiconductor device positioned within the receptacle is located in or positioned below a plane in which an associated upper surface of the interposer is located. In addition, the interposer includes contact areas, which are preferably located proximate to the periphery of the receptacle, each contact area corresponding to a bond pad of a semiconductor device positioned within the receptacle. Conductive traces extend from the conductive areas, on or through the substrate, to corresponding terminals arranged in an array over a surface of the interposer. The terminals may be located on the same surface of the interposer as the conductive areas or on the opposite surface of the interposer.

If the receptacle of the interposer extends completely through the substrate, a film may be positioned over the surface of the interposer opposite that on which the contact areas are located so as to close a bottom end of the receptacle and to facilitate the positioning of one or more semiconductor devices within the receptacle. The film may be removably secured to the interposer, thereby facilitating the removal of the film and, thus, a further reduction in the thickness of the interposer and a package including the interposer.

One or more semiconductor devices may be assembled with the interposer by positioning each semiconductor device within the receptacle. When the bottom end of the receptacle is enclosed, each semiconductor device positioned therein may be secured to the tape or other member covering the bottom end to fix the position of each semiconductor device relative to the substrate of the interposer. Each bond pad of a semiconductor device located within the receptacle of the interposer may be electrically connected with a corresponding contact area of the interposer by use of known intermediate conductive elements, such as bond wires.

A semiconductor device package incorporating teachings of the present invention includes the interposer-semiconductor device assembly, with each semiconductor device positioned within the receptacle being held in position by an encapsulant material extending between an outer periphery of that semiconductor device and a periphery of the receptacle. The encapsulant material may also cover intermediate conductive elements that extend between the bond pads of each semiconductor device and their corresponding contact areas on a surface of the interposer. If the encapsulant material extends above the surface of the interposer, it is preferred that the distance the encapsulant material protrudes from that surface is less than the distance the interposer will be spaced apart from the carrier substrate when conductive structures, such as solder balls or other discrete conductive elements, are secured to any terminals on that surface and connected to corresponding terminals of the carrier substrate. As the encapsulant material holds the one or more semiconductor devices within the receptacle, tape or any other structure that was previously used to maintain the position of each semiconductor device within the receptacle may be removed. Thus, the overall thickness of a package incorporating teachings of the present invention is substantially equal to the thickness of the interposer and the distances that conductive structures may protrude above a surface of the interposer.

An exemplary method for assembling a semiconductor device package in accordance with teachings of the present invention includes providing an interposer with a receptacle formed completely therethrough, positioning a film or tape over a bottom end of the receptacle, and removably securing the film or tape to a surface of the interposer to enclose the bottom end of the receptacle. One or more semiconductor devices are then positioned within the receptacle and secured to the film or tape enclosing the bottom end thereof. The bond pads of each semiconductor device located within the receptacle and their corresponding contact areas on the interposer are electrically connected to one another. An encapsulant material is introduced into the receptacle to extend laterally between the outer periphery of each semiconductor device within the receptacle and the inner periphery of the receptacle. The encapsulant material may also be disposed over the active surface of each semiconductor device located within the receptacle, as well as over intermediate conductive elements that connect the bond pads to their corresponding conductive areas on a surface of the interposer and adjacent portions of that surface of the interposer. Once each semiconductor device is held in place within the receptacle by encapsulant material, the tape or film that previously held the one or more semiconductor devices in place may be removed.

In the inventive packaging method, conductive structures, such as solder balls or other discrete conductive elements, may also be positioned on terminals which are arranged in an array over a surface of the interposer, each terminal corresponding to and in communication with a conductive area of the interposer and, thus, with the bond pad of a semiconductor device positioned within the receptacle.

The present invention also includes multi-chip assemblies of semiconductor device packages incorporating teachings of the present invention. These assemblies, which may be referred to as multi-chip modules (MCMs), may include two or more of the inventive semiconductor device packages in a stacked arrangement. Adjacent packages may be electrically connected to one another by connecting the conductive structures protruding from terminals of a first semiconductor device package to corresponding secondary terminals located on a back side of an adjacent, second semiconductor device package. Of course, at least some of the secondary terminals of a semiconductor device package incorporating teachings of the present invention may be electrically connected to bond pads of a semiconductor device of the semiconductor device package.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments for carrying out the invention:

FIGS. 5-10A illustrate an exemplary embodiment of an assembly and packaging method of the present invention.

DETAILED DESCRIPTION OF THE INVENTION

Figure 1:
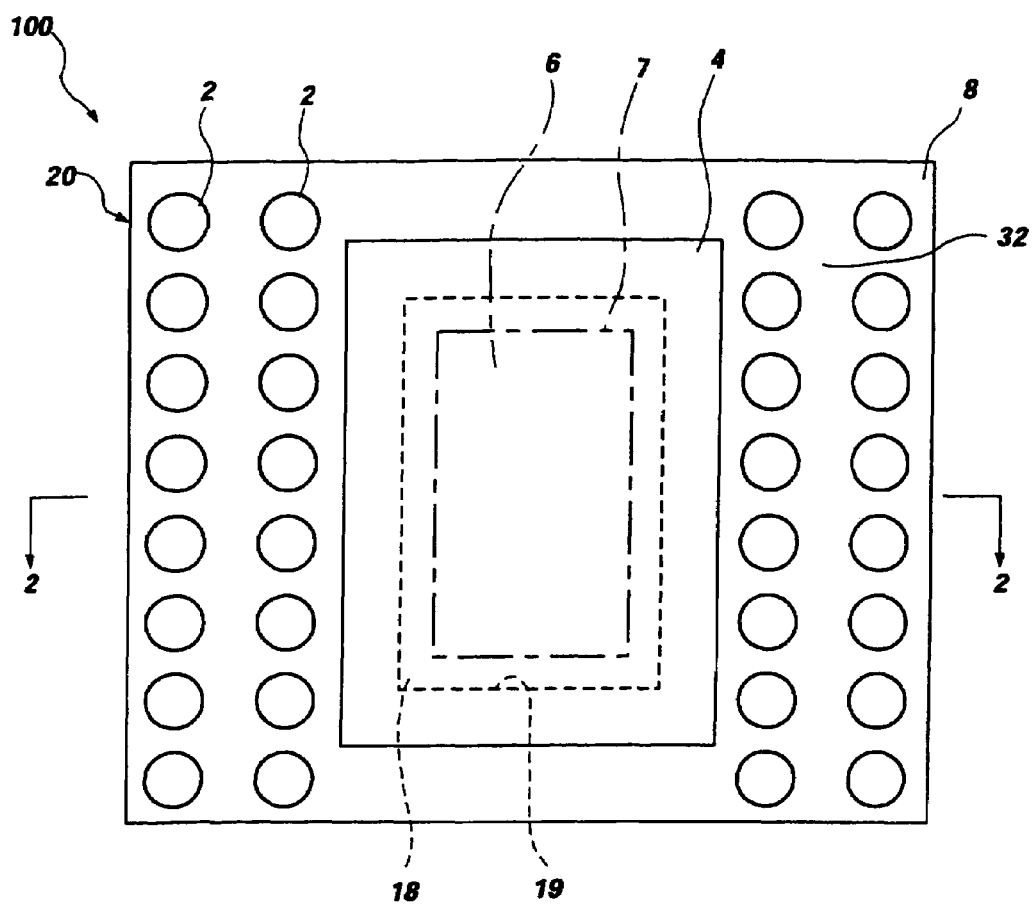
FIG. 1 is a top view of a semiconductor device package interposer and a semiconductor device package incorporating teachings of the present invention.
Figure 2:
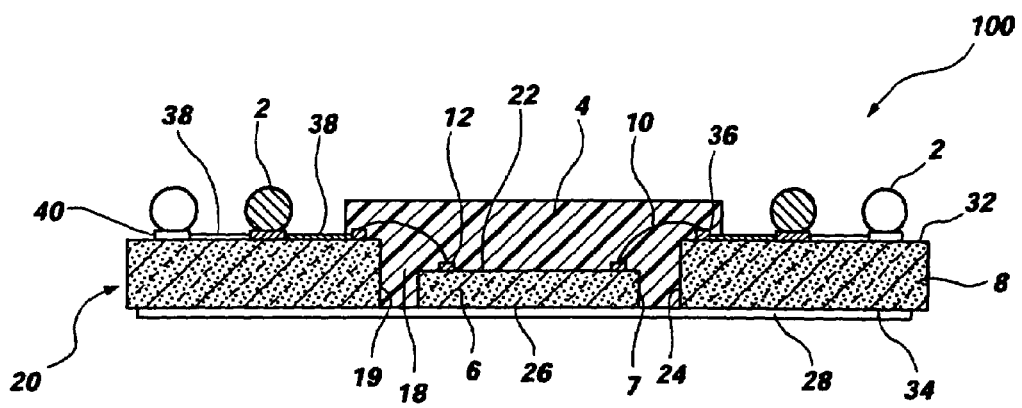
FIG. 2 is a cross-section taken along line 2-2 of FIG. 1.

Referring to FIGS. 1 and 2, a flip-chip type semiconductor device package 100 according to the present invention is illustrated. Package 100 includes an interposer 20 with a substantially planar substrate 8 and a receptacle 18 formed in and extending substantially through substrate 8. Package 100 also includes a semiconductor device 6 positioned within the receptacle 18 and encapsulant material 4 extending between semiconductor device 6 and a peripheral edge 19 of receptacle 18.

The substrate 8 of interposer 20 may be formed from either a rigid or flexible material. For example, the substrate 8 may be formed from silicon or another semiconductive material (e.g., gallium arsenide, indium phosphide, etc.), with at least some surfaces thereof being lined with an electrically insulative material to prevent shorting of the various electrical circuits running thereacross. Alternatively, other suitable interposer substrate materials may be used to form the substrate 8, including, without limitation, FR-4 resin, ceramic, and polyimide.

Figure 4:
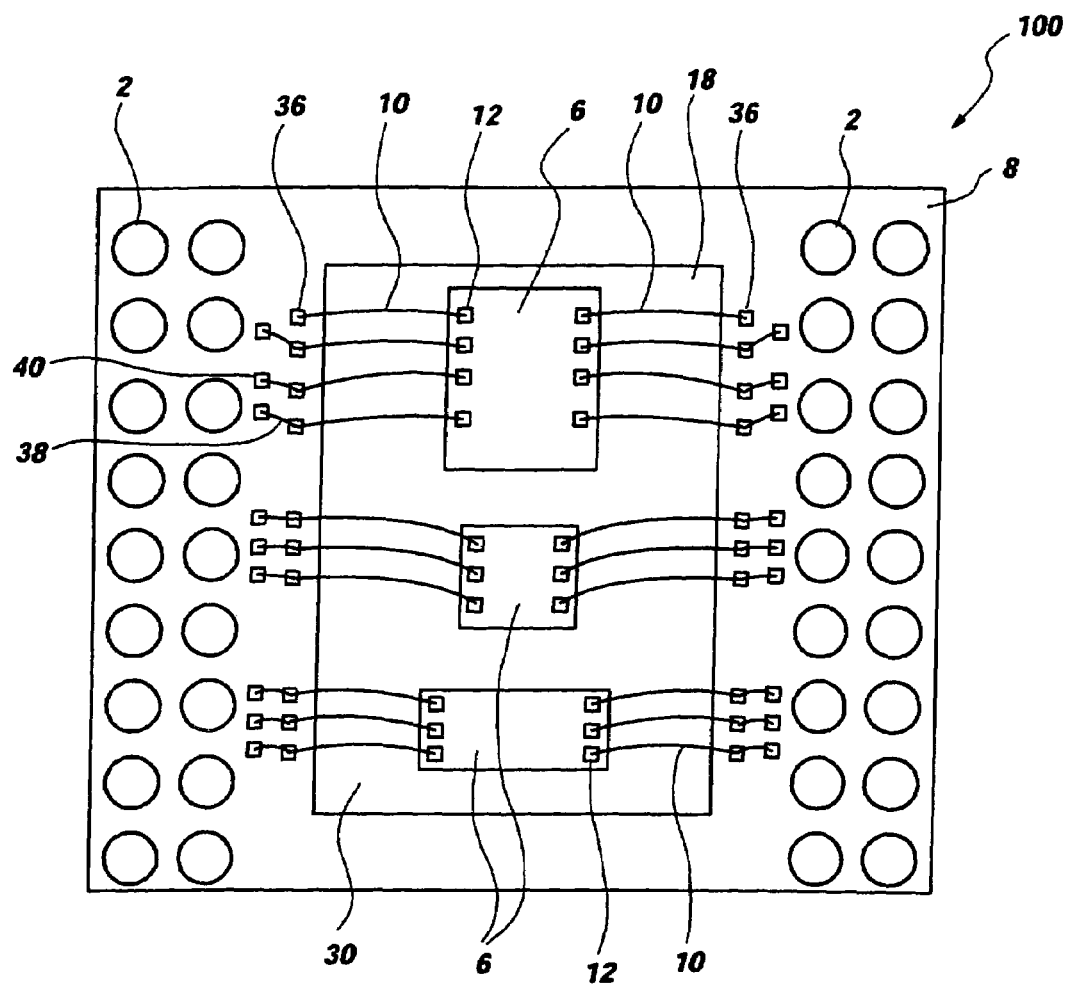
FIG. 4 is a top view of an assembly including an interposer of the present invention and multiple semiconductor devices within the receptacle of the interposer.

The receptacle 18 is formed somewhat centrally within and laterally confined by the material of the substrate 8. The receptacle 18 extends into the top surface 32 of the substrate 8 a sufficient distance that the receptacle 18 is configured to receive one or more (FIG. 4) semiconductor devices 6 (e.g., dice) in such a manner that the active surface 22 of each semiconductor device 6 positioned within the receptacle 18 is located in or positioned below the plane in which the top surface 32 of the substrate 8 is located, as shown in FIG. 2.

Figure 3:
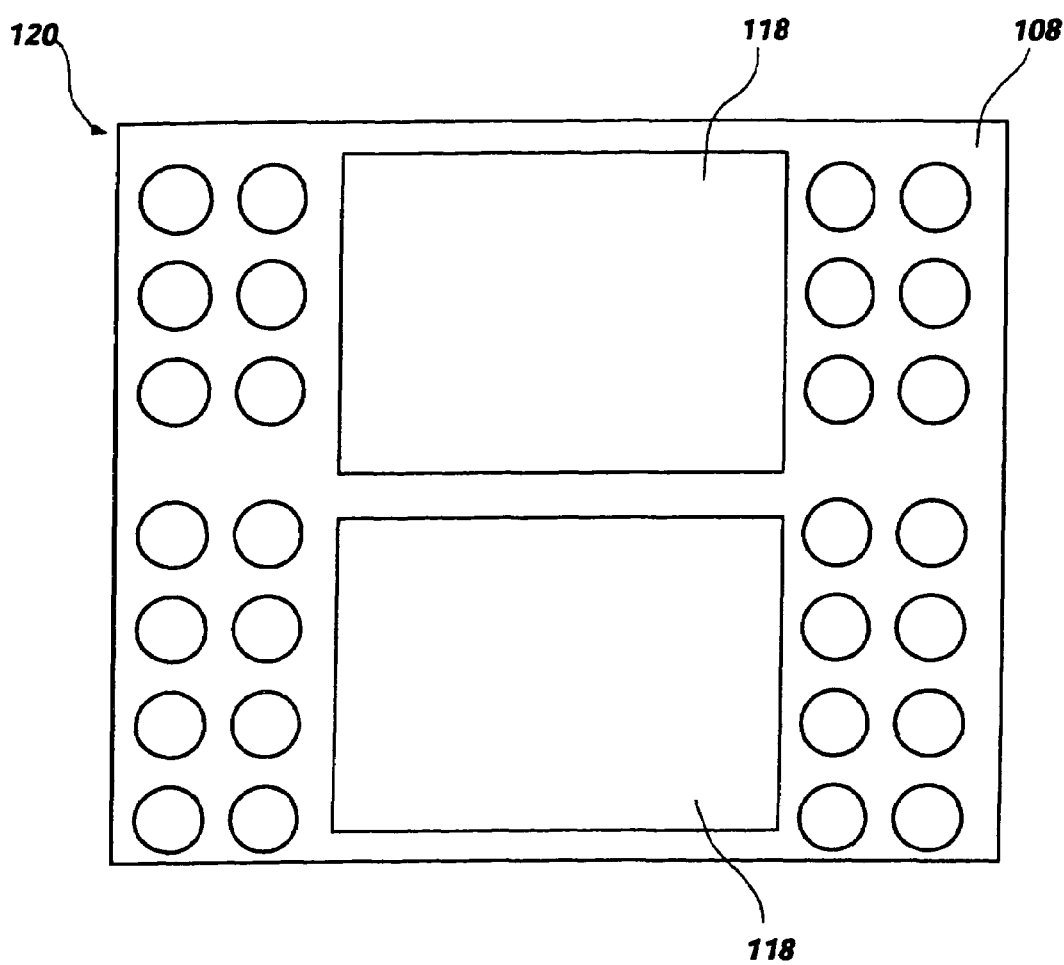
FIG. 3 is a top view of another embodiment of interposer according to the present invention.

Optionally, as shown in FIG. 3, an interposer 120 incorporating teachings of the present invention may include more than one receptacle 118 formed within a single substrate 108 thereof.

The height of the receptacle 18 may be substantially equal to a thickness of the substrate 8 and, as indicated above, preferably exceeds a thickness of a semiconductor device 6 to be positioned therein. When the receptacle 18 extends completely through the substrate 8, a thin film 28 (e.g., tape) may be positioned to enclose, or substantially cover, a bottom end 24 of the receptacle 18 to facilitate the placement of one or more semiconductor devices 6 in fixed positions therein. Such a film 28 may be secured to a bottom surface 34 of the substrate 8. Preferably, the film 28 is removably secured to the bottom surface 34 of the substrate 8, facilitating the subsequent removal of the film 28 and, thus, further reducing the thickness of a package 100 including the interposer 20. For example, an adhesive material (e.g., a pressure-sensitive adhesive material) may be used to secure the film 28 to the bottom surface 34 of the substrate 8.

The back side 26 (i.e., the side opposite the active surface 22) of each semiconductor device 6 of a package 100 may also be removably secured to the film 28, such as with an adhesive material. When the film 28 is removed from the substrate 8, the back side 26 of each semiconductor device 6 positioned thereon may be exposed.

If the receptacle 18 does not extend completely through the substrate 8, one or more semiconductor devices 6 may be positioned upon and secured (e.g., with an adhesive material) to a bottom surface (not shown) of the receptacle 18.

The interposer 20 also includes contact areas 36 (e.g., contact pads) formed on the top surface 32 thereof, adjacent the receptacle 18. Each contact area 36 corresponds with and is configured to be electrically connected to, via intermediate conductive elements 10, a bond pad 12 of a semiconductor device 6 positioned within the receptacle 18. The intermediate conductive elements 10 may comprise, for example, aluminum wire, gold, silver, conductive alloys, tape automated bonding (TAB) connections, or the like.

Conductive traces 38 extend substantially laterally from each contact area 36, on or through the substrate 8, to corresponding terminals 40 arranged in an array over the top surface 32 of the/substrate 8. Thus, each terminal 40 corresponds to, and is in communication with, a contact area 36 of the interposer 20. Consequently, when each contact area 36 and its corresponding bond pads 12 are electrically connected to one another by way of an intermediate conductive element 10, each terminal 40 communicates with a corresponding bond pad 12 of a semiconductor device 6 positioned within the receptacle 18.

Figure 2A:
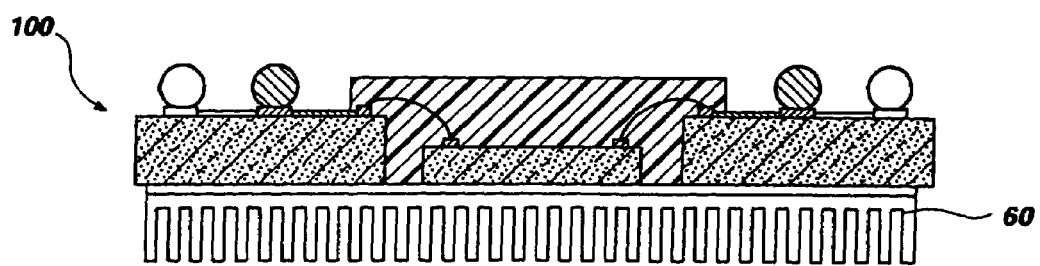
FIG. 2A is a cross-sectional representation of the package of FIG. 2 with a heat sink attached thereto.
Figure 2B:
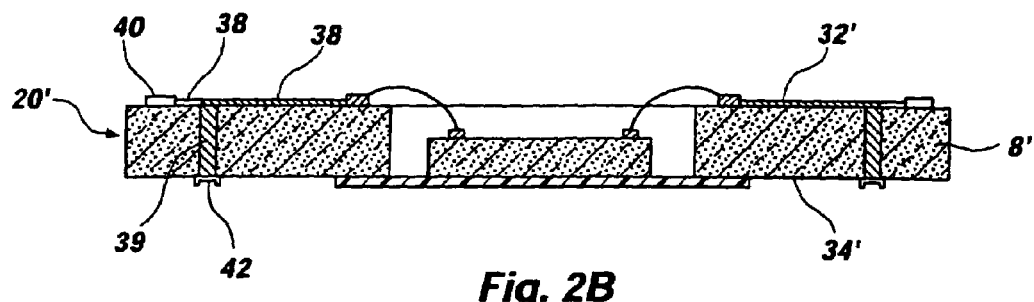
FIGS. 2B and 2C are cross-sectional representations of variations of the interposer illustrated in FIGS. 1 and 2, which variations include interposers with terminals on both surfaces thereof.

As depicted in FIG. 2B, some conductive traces 38 of an interposer 20' incorporating teachings of the present invention may extend to an electrically conductive via 39 that extends from the top surface 32' to the bottom surface 34' of the substrate 8' rather than to a terminal 40. Each such electrically conductive via 39, in turn, communicates with another terminal 42, which may be formed directly on the electrically conductive via 39 or communicate therewith by way of a conductive trace 38 that either extends across the bottom surface 34' of the substrate 8' or internally through the substrate 8', near the bottom surface 34' thereof.

Figure 2C:
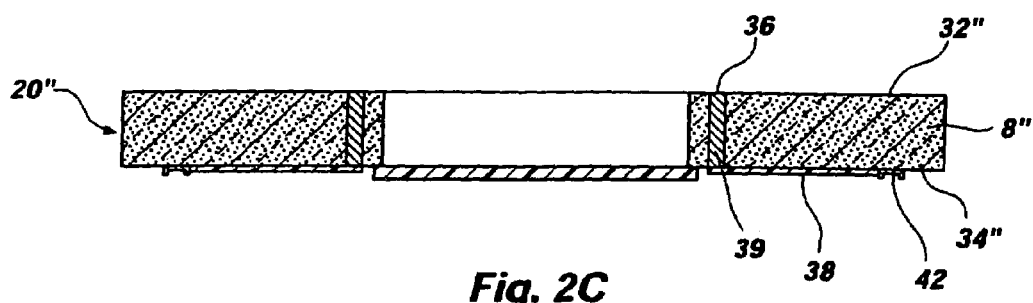

Alternatively, as shown in FIG. 2C, at least some contact areas 36 of an interposer 20" incorporating teachings of the present invention may comprise electrically conductive vias 39 that extend through the substrate 8", from the top surface 32" thereof to the bottom surface 34" thereof. Again, each of these contact areas 36 may communicate with a terminal 42 formed on the bottom surface 34" of the substrate 8", either directly or by way of a substantially laterally extending conductive trace 38.

Figure 2D:
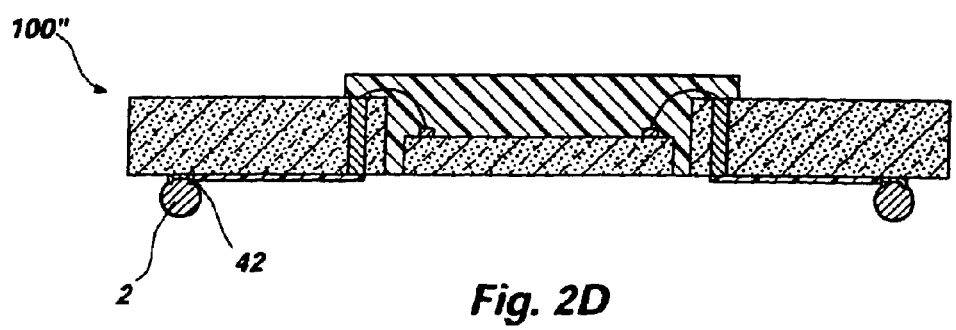
FIG. 2D is a cross-sectional representation of a package including the interposer of FIG. 2C.
Figure 11:
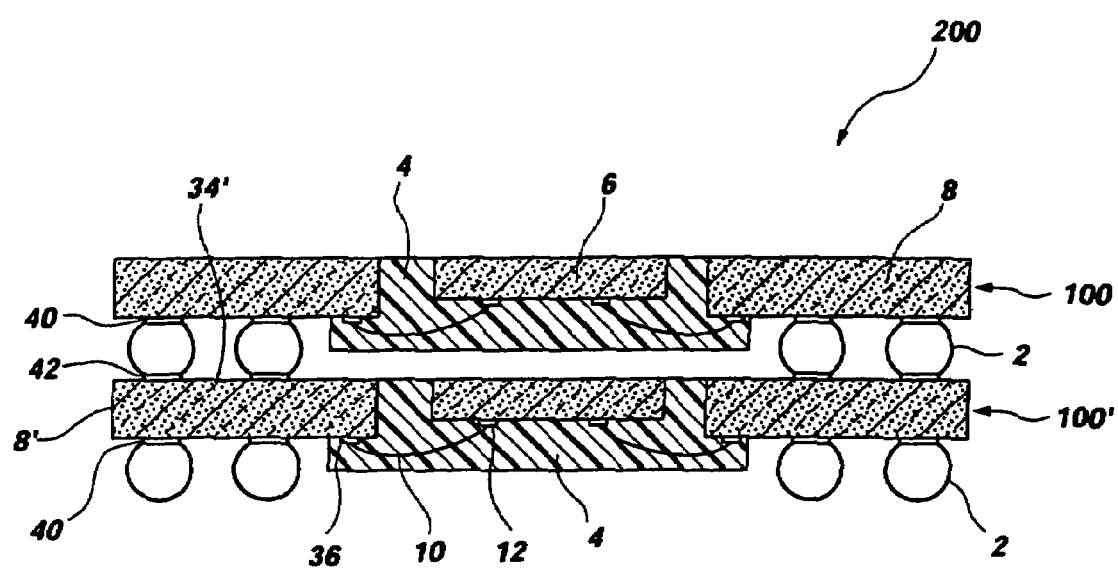
FIG. 11 is a cross-sectional representation of a multi-chip module including semiconductor device packages according to the present invention.

Referring to FIGS. 1, 2, and 2D, conductive structures 2, such as balls, bumps, columns, pillars, or other structures formed from a conductive material, such as solder, metal, or z-axis conductive elastomer, may be secured to terminals 40, 42 to facilitate communication between the one or more semiconductor devices of the semiconductor device package 100, 100" and a carrier substrate or another package 100' (FIG. 11).

Package 100 also includes a quantity of dielectric encapsulant material 4 within each receptacle 18 of the interposer 20. The encapsulant material 4 extends laterally between at least portions of an outer periphery 7 of each semiconductor device 6 positioned within the receptacle 18 and a peripheral edge 19 of the receptacle 18. The encapsulant material 4 at least partially secures and laterally confines each semiconductor device 6 within the receptacle 18. As shown in FIG. 1, the encapsulant material 4 may substantially fill the receptacle 18 and may also at least partially cover the active surface 22 of the semiconductor device 6, as well as the intermediate conductive elements 10 and portions of the top surface 32 of the substrate 8 over which the intermediate conductive elements 10 extend. If the encapsulant material 4 protrudes above a plane in which the top surface 32 of the substrate 8 is located, the distance the encapsulant material 4 protrudes from the top surface 32 is less than the distance the top surface 32 will be spaced apart from a carrier substrate or another semiconductor device package 100'(FIG. 11) by conductive structures 2 when the package 100 is electrically connected to the carrier substrate or other package 100'.

Preferably, the package 100 of the present invention has a total thickness of less than about 1 mm, making the package 100 suitable for use in compact electronic devices, such as cellular telephones, handheld computers, and portable computers, where such low-profile packages are required or desired.

As illustrated in FIG. 2A, if desired, the package 100 may have a heat sink 60 attached thereto, as known in the art, to improve its thermal performance.

FIGS. 5-10A illustrate an exemplary method for assembling a package incorporating teachings of the present invention.

FIGS. 5 and 5A illustrate interposer strips 50, each of which includes a plurality of physically connected interposers 20 formed thereon. Each interposer 20 of interposer strip 50 includes a receptacle 18 formed therethrough, as well as contact areas 36 positioned on a top surface 32 of substrate 8. Although not illustrated in FIGS. 5 and 5A, each interposer 20 may also include terminals 40, 42 (FIGS. 2 and 2B) corresponding to and in communication with the contact areas 36 of that interposer 20.

As the receptacle 18 extends completely through the substrate 8 of each interposer 20, a film 28 (e.g., tape) is positioned over a bottom end 24 of the receptacle 18 to cover at least a portion of the bottom end 24. The film 28 may comprise either a single strip or several smaller pieces.

FIGS. 6 and 6A illustrate the positioning of a semiconductor device 6 within the receptacle 18 of each interposer 20. Each semiconductor device 6 may be secured into position within its corresponding receptacle 18 by securing the back side 26 thereof to a surface of the film 28 exposed to the receptacle 18, such as with a suitable adhesive material. Although FIG. 7 depicts two semiconductor devices 6 within each receptacle 18, any number of semiconductor devices 6 may be positioned within a receptacle 18.

Once the semiconductor devices 6 have been positioned within their corresponding receptacles 18, the bond pads 12 (FIG. 2) of each semiconductor device 6 may be electrically connected with corresponding contact areas 36 of the corresponding interposer 20 by use of known types of intermediate conductive elements 10, such as bond wires, tape-automated bonds ("TABs"), or bonded leads, as illustrated in FIGS. 7 and 7A. Intermediate conductive elements 10 may be positioned or formed between each bond pad 12 and its corresponding contact area 36 and respective ends thereof bonded to the bond pad 12 and the contact area 36, as known in the art.

Turning now to FIGS. 8 and 8A, a suitable, known type of encapsulant material 4 (e.g., a filled polymer transfer molding compound or a silicone or epoxy type glob-top type encapsulant material) is introduced into the receptacle 18 of each interposer 20 of the interposer strip 50. The encapsulant material 4 extends laterally between at least portions of the outer periphery 7 of each semiconductor device 6 within the receptacle 18 and a peripheral edge 19 of the receptacle 18. The encapsulant material 4 may also substantially cover the intermediate conductive elements 10 that extend between the bond pads 12 of each semiconductor device 6 and the contact areas 36 of the interposer 20. Accordingly, the encapsulant material 4 may substantially fill the receptacle 18 and at least partially cover the active surface 22 of each semiconductor device 6, as well as the regions of the top surface 32 of the substrate 8 of the interposer 20 at which the contact areas 36 are located.

Once the encapsulant material 4 has been introduced into the receptacle 18, it is permitted to harden, set, or cure. For example, if a thermoplastic resin is used as the encapsulant material 4, the encapsulant material 4 will harden upon cooling of the same. If a transfer molding compound or other thermosetting resin is used as the encapsulant material 4, the encapsulant material 4 may be cured by applying heat and/or pressure to the same. If the encapsulant material 4 is a photoimageable polymer, the encapsulant material 4 may be set or cured by exposing the same to an appropriate wavelength of radiation.

As depicted in FIG. 9, when encapsulant material 4 has hardened, set, or cured, the encapsulant material 4 holds the one or more semiconductor devices 6 within the receptacle 18. Accordingly, the film 28 (FIG. 8A) may be removed from the bottom surface 34 of the substrate 8 of each interposer 20, with each semiconductor device 6 being suspended in the receptacle 18 of that interposer 20 and the back side 26 of each semiconductor device 6 within the receptacle 18 being exposed.

FIGS. 10 and 10A illustrate that conductive structures 2 may be secured to terminals 40, 42 (FIGS. 2A and 2B) mounted on the top surface 32 of the substrate 8 to allow connection to another package 100 (FIG. 11) or carrier substrate, as known in the art. The package 100 may be mounted with conductive structures 2 in either a dual in-line matrix, a peripheral matrix, or another array pattern. If an interposer strip 50 is used to fabricate the packages 100, adjacent packages 100 may be separated from one another after fabrication by known techniques, such as by use of a wafer saw or otherwise, as known in the art.

The overall thickness of the resulting semiconductor device package 100 is substantially equal to the combined thicknesses of the interposer 20 and the distances that conductive structures 2 protrude above a surface of the interposer 20.

While FIGS. 5-10A depict the inventive process using an interposer strip 50 having a plurality of physically connected interposers 20, each interposer 20 having a single receptacle 18 with multiple semiconductor devices 6 mounted therein, it will be understood that the process is applicable to any interposer 20 with a receptacle 18 extending substantially therethrough, including a single interposer 20 and an interposer 20 having more than one receptacle 18.

As depicted in FIG. 11, the present invention also includes stacked assemblies of semiconductor device packages 100, 100' incorporating teachings of the present invention, which assemblies are typically referred to as multi-chip modules ("MCMs") 200. Adjacent packages 100, 100' may be electrically connected to one another by connecting the conductive structures 2 protruding from terminals 40 of a first package 100 to corresponding terminals 42 located on the bottom surface 34' (shown on top as the package 100' is in an inverted orientation) of an interposer substrate 8' of an adjacent, second package 100'. While FIG. 11 depicts a multi-chip module 200 including two packages 100, 100', it will be understood that a multi-chip module incorporating teachings of the present invention may include more than two packages.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for assembling semiconductor device components, comprising:
   securing a film to a first surface of a substantially planar substrate comprising semiconductive material, at least partially over an opening of a receptacle formed substantially through the substantially planar substrate and extending from the first surface to a second surface of the substantially planar substrate;
   positioning at least one semiconductor device within the receptacle with a back side of the at least one semiconductor device positioned against the film;
   securing the back side of the at least one semiconductor device to the film; and
   electrically connecting at least one bond pad on an active surface of the at least one semiconductor device to at least one conductive element carried by the second surface of the substantially planar substrate.

2. The method of claim 1, further comprising:
   introducing encapsulant material between at least a portion of an outer periphery of the at least one semiconductor device and a periphery of the receptacle.

3. The method of claim 2, wherein introducing encapsulant material comprises introducing encapsulant material in contact with an active surface of the at least one semiconductor device.

4. The method of claim 3, wherein introducing encapsulant material comprises substantially covering the active surface of the at least one semiconductor device.

5. The method of claim 2, wherein introducing encapsulant material comprises substantially filling space remaining within the receptacle.

6. The method of claim 2, wherein introducing encapsulant material comprises at least partially confining the at least one semiconductor device within the receptacle.

7. The method of claim 2, further comprising:
   removing the film following introducing encapsulant material.

8. The method of claim 1, wherein positioning comprises positioning a back side of the at least one semiconductor device against the film.

9. The method of claim 1, wherein positioning comprises positioning a plurality of semiconductor devices within the receptacle.

10. The method of claim 1, further comprising:
    electrically connecting the at least one semiconductor device to an interposer.

11. The method of claim 10, wherein electrically connecting comprises positioning an intermediate conductive element between at least one bond pad of the at least one semiconductor device and a corresponding contact area of the interposer.

12. The method of claim 11, wherein positioning the intermediate conductive element comprises connecting a bond wire between the at least one bond pad and the corresponding contact area of the interposer.

13. The method of claim 10, further comprising:
    testing the at least one semiconductor device and an electrical connection between the at least one semiconductor device and the interposer; and
    attaching the at least one semiconductor device to the interposer.

14. The method of claim 1, further comprising:
    placing a conductive structure on at least one terminal of the interposer.

15. A method for assembling semiconductor device components, comprising:
    positioning at least one semiconductor device within a receptacle that extends substantially through an interposer comprising a semiconductor material, a back side of the at least one semiconductor device on a first surface of a removable retention element extending over at least a portion of the receptacle.

16. The method of claim 15, wherein positioning comprises positioning the at least one semiconductor device on a removable retention element that is secured to a surface of the interposer.

17. The method of claim 15, wherein positioning comprises positioning the at least one semiconductor device on a removable retention element comprising a film that lacks conductive elements.

18. The method of claim 15, further comprising:
    securing the at least one semiconductor device to the removable retention element.

19. The method of claim 15, further comprising:
    introducing material between at least a portion of an outer periphery of the at least one semiconductor device and at least a portion of an inner periphery of the receptacle, without introducing material onto an active surface of the at least one semiconductor device, to facilitate retention of the at least one semiconductor device within the receptacle.

20. The method of claim 19, wherein introducing comprises introducing encapsulant material.

21. The method of claim 19, further comprising:
    removing the retention element following the act of introducing.

22. The method of claim 15, further comprising:
    electrically connecting the at least one semiconductor device to the interposer.

* * * * *